United States Patent [19]

Maruyama et al.

[11] Patent Number: 5,962,385
[45] Date of Patent: Oct. 5, 1999

[54] CLEANING LIQUID FOR SEMICONDUCTOR DEVICES

[75] Inventors: Taketo Maruyama; Ryuji Hasemi; Hidetoshi Ikeda; Tetsuo Aoyama, all of Niigata-ken, Japan

[73] Assignee: Mitsubishi Gas Chemical Company, Inc., Tokyo, Japan

[21] Appl. No.: 09/133,627

[22] Filed: Aug. 13, 1998

[30] Foreign Application Priority Data

Aug. 18, 1997 [JP] Japan ..................................... 9-221564

[51] Int. Cl.$^6$ .............................. C09K 13/00; C11D 7/50
[52] U.S. Cl. ........................ 510/176; 510/175; 510/505; 510/506; 510/257; 510/500; 510/493
[58] Field of Search ..................................... 510/175, 176, 510/257, 505, 506, 500, 493, 499, 501, 274, 255, 258, 401

[56] References Cited

U.S. PATENT DOCUMENTS

| | | | |
|---|---|---|---|
| 4,215,005 | 7/1980 | Vander Mey | 252/153 |
| 5,478,436 | 12/1995 | Winebarger et al. | 156/636.1 |
| 5,571,447 | 11/1996 | Ward et al. | 510/206 |
| 5,630,904 | 5/1997 | Aoyama et al. | 438/669 |
| 5,698,503 | 12/1997 | Ward et al. | 510/176 |
| 5,709,756 | 1/1998 | Ward et al. | 134/1.3 |

*Primary Examiner*—Yogendra Gupta
*Assistant Examiner*—Dawn L. Garrett
*Attorney, Agent, or Firm*—Frishauf, Holtz, Goodman, Langer & Chick, P.C.

[57] ABSTRACT

A cleaning liquid for semiconductor devices comprising 1.0 to 5% by weight of a fluorine compound of the formula $R_4NF$, wherein R is a hydrogen atom or a $C_1$–$C_4$ alkyl group, 72 to 80% by weight of an organic solvent soluble in water, and the remaining amount being water. The cleaning liquid can rapidly and completely at a low temperature remove resist residues left remaining after dry etching and ashing in the wiring step in the production of semiconductor integrated circuits, and the cleaning liquid does not corrode wiring materials.

19 Claims, 1 Drawing Sheet

CLEANING LIQUID FOR SEMICONDUCTOR DEVICES

BACKGROUND OF THE INVENTION
1. Field of the Invention

The present invention relates to a cleaning liquid for semiconductor devices used in the process for producing semiconductor integrated circuits, and more particularly to a cleaning liquid for semiconductor devices used for removal of resist residues left remaining after dry etching.

2. Description of the Related Arts

Semiconductor integrated circuits are produced in accordance with the following procedures: an inorganic substrate is coated with a photoresist; patterns are formed on the photoresist by exposure of light followed by development; the patterned photoresist is used as a mask, and portions of the inorganic substrate not masked by the photoresist are dry etched with a reactive gas and then ashed; and resist residues (protective deposit films) left remaining on the inorganic substrate are removed from the inorganic substrate. A gas containing chlorine is generally used to dry etch the photoresist coated on the inorganic substrate. Resist residues are formed by the reaction of the photoresist with the reactive gas containing chlorine during the dry etching. Protective deposit films left remaining on the inorganic substrate cause disconnection and abnormal wiring, and various troubles arise. Therefore, complete removal of the protective deposit films is desired.

Alkaline cleaning liquids have heretofore been used as the liquid for removing resist residues. Examples of the alkaline cleaning liquid include a cleaning liquid comprising an additional product of ethylene oxide to an alkanolamine or a polyalkylenepolyamine, a sulfone compound, and a glycol monoalkyl ether (Japanese Patent Application Laid-Open No. Showa 62(1987)-49355) and a cleaning liquid comprising dimethylsulfoxide as the main component and a diethylene glycol monoalkyl ether and an organic hydroxy compound containing nitrogen as other components (Japanese Patent Application Laid-Open No. Showa 64(1989)-42653). However, the above cleaning liquids become alkaline during the use because of dissociation of the amine caused by absorbed water. When cleaning is conducted with water without using an organic solvent such as an alcohol after the removal of the resist residues, water used in the cleaning becomes alkaline. This accelerates corrosion of aluminum which is frequently used as the wiring material in the formation of fine circuits. Therefore, the above cleaning liquids are not preferable for use in the recent working of fine structures which require rigorous precision.

Cleaning liquids for semiconductor devices comprising an aqueous solution containing a fluorine compound, an organic solvent, and a corrosion inhibitor have recently been used as a cleaning liquid which shows an excellent ability to remove resist residues and can be used conveniently (Japanese Patent Application Laid-Open Nos. Heisei 7(1995)-201794 and Heisei 8(1996)-20205).

However, the condition of dry etching continues to become severer. For example, a gas containing fluorine is added to a gas containing chlorine for dry etching, and a high density plasma is used for dry etching. This change in the condition causes further chemical change in the resist residues, and the above cleaning liquids for semiconductor devices cannot achieve complete removal of the resist residues.

When an alkali metal such as sodium and potassium is present in a cleaning liquid, the metal is adsorbed on the surface of a substrate. When a device is formed on the substrate in this condition, a problem arises in that the properties of the device tend to deteriorate even at a low temperature because of the presence of mobile ions which are derived from the alkali metal and move within the device, and thus yield of the device tends to decrease.

As described above, a cleaning liquid which can remove resist residues left remaining after dry etching and ashing in the wiring step in the production of semiconductor integrated circuits rapidly and completely at a low temperature and does not corrode wiring materials has been desired.

SUMMARY OF THE INVENTION

As the result of extensive studies by the present inventors to solve the above problems of the conventional technologies, it was found that resist residues which were left remaining after dry etching with a reactive gas and ashing could be removed very easily without corrosion of wiring materials when an aqueous solution comprising a fluorine compound and a large amount of a solvent soluble in water was used as the cleaning liquid for semiconductor devices. The present invention has been completed on the basis of this knowledge.

Accordingly, the present invention provides a cleaning liquid for semiconductor devices comprising 0.1 to 10% by weight of a fluorine compound, 72 to 80% by weight of an organic solvent soluble in water, remaining amount of water.

Figure 1:
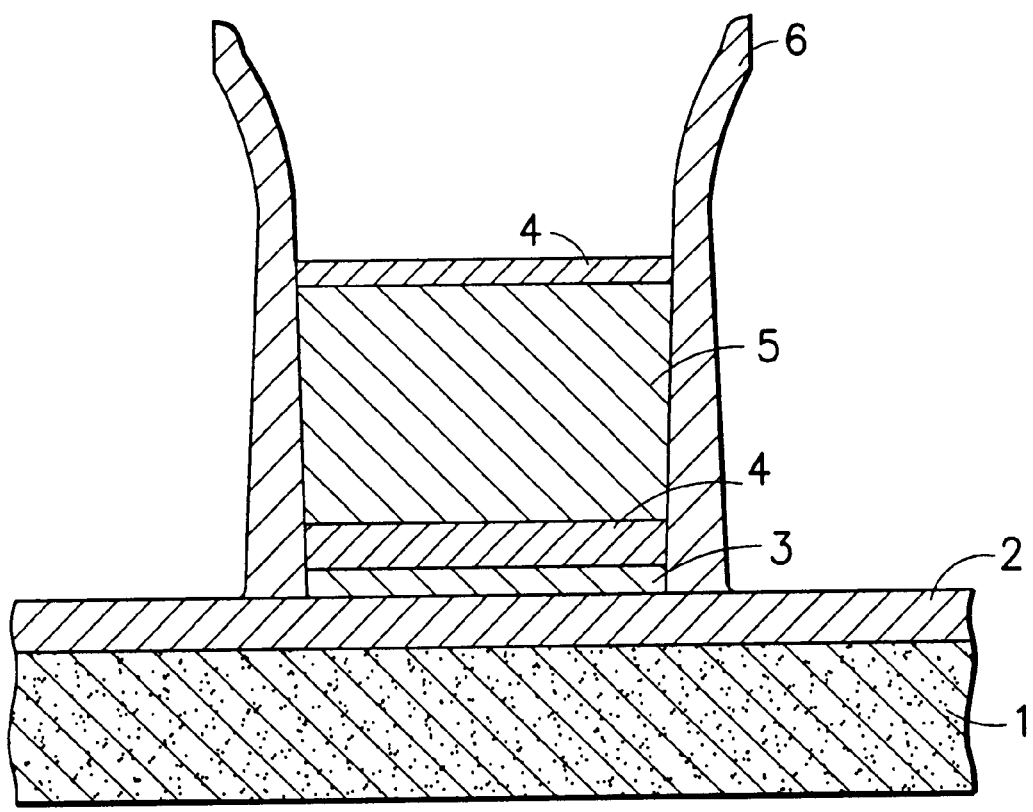
FIG. 1 shows a sectional view of a semiconductor device which has been dry etched using a resist film as a mask to form a circuit of an aluminum alloy (Al—Si—Cu) and ashed with oxygen plasma.

1 A silicon substrate
2 An oxide film
3 Titanium
4 Titanium nitride
5 A circuit of an aluminum alloy (Al—Si—Cu)
6 A resist residue

DESCRIPTION OF THE PREFERRED EMBODIMENTS

The fluorine compound is a compound represented by $R_4NF$, wherein R represents hydrogen atom or an alkyl group having 1 to 4 carbon atoms. Examples of the fluorine compound include ammonium fluoride, hydrofluoric acid, acidic ammonium fluoride, hydrogen fluoride salt of methylamine, hydrogen fluoride salt of ethylamine, hydrogen fluoride salt of propylamine, tetramethylammonium fluoride, and tetraethylammonium fluoride. Among these compounds, ammonium fluoride and tetramethylammonium fluoride are preferable, and ammonium fluoride is more preferable. The fluorine compound can be used singly or as a combination of two or more compounds. The fluorine compound is used in such an amount that the concentration in the entire solution is in the range of 0.1 to 10% by weight, preferably in the range of 0.1 to 5% by weight, more preferably in the range of 0.5 to 1.5% by weight. When the amount of the fluorine compound exceeds the above range, corrosion of wiring materials such as aluminum takes place. When the amount of the fluorine compound is less than the above range, the ability of removing resist residues decreases. Therefore, such amounts are not preferable.

Examples of the organic solvent soluble in water include amides, such as formamide, monomethylformamide, dimethylformamide, acetamide, methylacetamide, dimethylacetamide, and N-methylpyrrolidone; ethers, such as ethylene glycol monomethyl ether, diethylene glycol monomethyl ether, diethylene glycol monobutyl ether, diethylene glycol dimethyl ether, and diethylene glycol diethyl ether; sulfones, such as sulfolane; sulfoxides, such as dimethylsulfoxide; and alcohols, such as methanol, ethanol, isopropanol, ethylene glycol, and glycerol. Among these organic solvents soluble in water, dimethylformamide, dimethylacetamide, N-methylpyrrolidone, and dimethylsulfoxide are preferable. The organic solvent soluble in water can be used singly or as a combination of two or more solvents. The organic solvent soluble in water is used in such an amount that the concentration in the entire solution is in the range of 72 to 80% by weight, preferably in the range of 72 to 75% by weight. When the amount of the organic solvent soluble in water is less than 72% by weight in the entire solution, corrosion of wiring materials increases. When the amount exceeds 80% by weight, the ability to remove resist residues is inferior.

The amount of water used in the present invention is not particularly limited and can be selected in accordance with the amounts of the fluorine compound and the organic solvent soluble in water.

As described above, when an alkali metal such as sodium and potassium is present in the cleaning liquid, the metal is adsorbed on the surface of the substrate, and drawbacks arise in that the properties of the device tend to deteriorate and that the yield of the device decreases. To improve the drawbacks, it is preferable that water, the fluorine compound, and the organic solvent soluble in water used in the cleaning liquid of the present invention are treated with an ion exchange membrane or an ion exchange resin in advance so that the concentration of ions of alkali metals in the cleaning liquid for semiconductor devices of the present invention is decreased to 0.5 ppm or less.

The cleaning liquid for semiconductor devices of the present invention is used to remove resist residues which are left remaining after an inorganic substrate coated with a photoresist has been dry etched with a reactive gas and then ashed with plasma. The removal of the resist residues with the cleaning liquid for semiconductor devices of the present invention can be, in general, conducted satisfactorily at room temperature but may be conducted under heating, where necessary. As the rinse liquid used in the present invention, an alcohol, such as methyl alcohol, ethyl alcohol, and isopropanol, can be used. Ultra-pure water alone can also be used as the rinse liquid without any problem. Alternatively, a mixture of the above alcohol and ultra-pure water can be used as the rinse liquid without any problem. It is preferable that a surfactant, such as a cationic surfactant, an anionic surfactant, and nonionic surfactant, is added to the cleaning liquid of the present invention, where necessary. A corrosion inhibitor for the inorganic substrate, such as a sugar, a sugar alcohol, a polyphenol, and a quaternary ammonium salt, can be added without any problem.

Examples of the inorganic substrate to which the cleaning liquid of the present invention is applied include semiconductor wiring materials, such as silicon, a-silicon, polysilicon, films of silicon oxide, films of silicon nitride, aluminum, aluminum alloys, titanium, titanium—tungsten, titanium nitride, tungsten, tantalum, tantalum oxides, tantalum alloys, chromium, chromium oxides, chromium alloys, and ITO (indium tin oxides); compound semiconductors, such as gallium—arsenic, gallium—phosphorus, and indium—phosphorus; and glass substrates, such as LCD.

To summarize the advantages of the present invention, the cleaning liquid for semiconductor devices of the present invention can remove resist residues left remaining after dry etching with a reactive gas and ashing very easily without corrosion of wiring materials.

EXAMPLES

The present invention is described more specifically with reference to examples in the following. However, the present invention is not limited by the examples.

Examples 1 to 11

A circuit of an aluminum alloy (Al—Si—Cu) was formed by dry etching using a resist film as the mask. The formed circuit was ashed with oxygen plasma, and a semiconductor device shown in FIG. 1 was prepared. In the semiconductor device, an oxide film 2 is formed on a silicon substrate 1. The aluminum alloy 5 which is the circuit material is disposed on the oxide film 2, and resist residues 6 are left remaining on both sides. Titanium 3 and titanium nitride 4 are disposed as barrier metals.

The semiconductor device prepared above was dipped into a cleaning liquid for semiconductor device having a composition shown in Table 1 in the condition also shown in Table 1. After the dipping, the device was rinsed with ultra-pure water and dried. Removal of the resist residues on the sides and corrosion of the surface of the aluminum alloy were examined by observation using an electron microscope (SEM). The electric property of the semiconductor device after the rinse was measured in accordance with the following method of EBIC (Electron-Beam Induced Current): The surface of a semiconductor device was scanned by an electronic beam, and the electric current flowing through the device was two-dimensionally measured and displayed as an image to detect defects in a wafer (crystal). When defects were present, electromigration (disconnection) takes place, and the electric property deteriorates. Therefore, when defects were absent, the electric property was evaluated as good, and when defects were present, the electric property was evaluated as poor. The results are shown in Table 1.

The results of the observation are expressed as shown in the following:

[Removal of resist residues]

| excellent: | completely removed |
|---|---|
| good: | nearly completely removed |
| fair: | a portion of the residue remained |
| poor: | most of the residue remained |

[Corrosion]

| excellent: | no corrosion found |
|---|---|
| good: | little corrosion found |
| fair: | corrosion of a crater shape or a pit shape found |
| poor: | rough surfaces all over the aluminum circuit; depression of Al-Si-Cu layer observed |

The concentration of alkali ions (Na+K) in the cleaning liquid was measured in accordance with the flameless atomic absorption sepectrometry.

TABLE 1-1

|  | fluorine compound | | solvent soluble in water | | additive | |
| --- | --- | --- | --- | --- | --- | --- |
|  | compound | concn. (% by wt.) | solvent | concn. (% by wt.) | additive | concn. (% by wt.) |
| Example 1 | ammonium fluoride | 1.0 | dimethyl-formamide | 72 | — | — |
| Example 2 | ammonium fluoride | 1.0 | dimethyl-formamide | 72 | TMAF[1) | 1.0 |
| Example 3 | ammonium fluoride | 1.0 | N-methyl-pyrrolidone | 74 | — | — |
| Example 4 | ammonium fluoride | 1.0 | N-methyl-pyrrolidone | 72 | nonionic surfactant | 0.05 |
| Example 5 | ammonium fluoride | 3.0 | dimethyl-formamide | 75 | — | — |
| Example 6 | ammonium fluoride | 1.0 | dimethyl-acetamide | 72 | — | — |
| Example 7 | ammonium fluoride | 1.0 | dimethyl-sulfoxide | 72 | — | — |
| Example 8 | tetramethyl-ammonium fluoride | 1.5 | dimethyl-formamide | 78 | — | — |
| Example 9 | ammonium fluoride | 0.5 | dimethyl-formamide | 76 | — | — |
| Example 10 | ammonium fluoride | 0.5 | N-methyl-pyrrolidone | 77 | — | — |
| Example 11 | ammonium fluoride | 1.0 | dimethyl-formamide | 78 | — | — |

[1)TMAF: tetramethylammonium formate

TABLE 1-2

|  | water | concn. of alkali | condition of dipping | | removal of | corrosion | |
| --- | --- | --- | --- | --- | --- | --- | --- |
|  | concn. (% by wt.) | ions (ppm) | temperature (° C.) | time | resist residues | of Al alloy | electric property |
| Example 1 | 27.0 | 0.2 | 23 | 5 | excellent | excellent | good |
| Example 2 | 26.0 | 0.1 | 23 | 5 | excellent | excellent | good |
| Example 3 | 25.0 | 0.2 | 23 | 5 | excellent | excellent | good |
| Example 4 | 26.95 | 0.1 | 23 | 5 | excellent | excellent | good |
| Example 5 | 22.0 | 0.05 | 23 | 5 | excellent | good | good |
| Example 6 | 27.0 | 0.1 | 23 | 5 | excellent | good | good |
| Example 7 | 27.0 | 0.2 | 23 | 5 | excellent | good | good |
| Example 8 | 20.5 | 0.1 | 23 | 5 | excellent | excellent | good |
| Example 9 | 23.5 | 0.05 | 23 | 10 | excellent | excellent | good |
| Example 10 | 22.5 | 0.3 | 23 | 10 | excellent | excellent | good |
| Example 11 | 21.0 | 0.2 | 23 | 10 | excellent | excellent | good |

Comparative Example 1 to 4

A semiconductor device prepared in accordance with the same procedures as those conducted in above Examples was dipped into a cleaning liquid for semiconductor device having a composition shown in Table 2 in the condition also shown in Table 2. After the dipping, the device was rinsed with ultra-pure water and dried. Removal of the resist residues on the sides and corrosion of the surface of the aluminum alloy were examined by observation using an electron microscope (SEM). The electric property was measured in accordance with the method described above. The results are shown in Table 2.

The results of the observation by SEM are expressed in the same manner as that in Examples.

TABLE 2-1

|  | fluoride compound | | solvent soluble in water | | additive | |
| --- | --- | --- | --- | --- | --- | --- |
|  | compound | concn. (% by wt.) | solvent | concn. (% by wt.) | addi-tive | concn. (% by wt.) |
| Comparative Example 1 | ammonium fluoride | 1.0 | — | — | — | — |
| Comparative Example 2 | — | — | dimethyl-formamide | 72 | — | — |
| Comparative Example 3 | ammonium fluoride | 0.05 | dimethyl-formamide | 72 | — | — |

TABLE 2-1-continued

| | fluoride compound | | solvent soluble in water | | additive | |
|---|---|---|---|---|---|---|
| | compound | concn. (% by wt.) | solvent | concn. (% by wt.) | additive | concn. (% by wt.) |
| Comparative Example 4 | ammonium fluoride | 0.03 | dimethylacetamide | 90 | — | — |

TABLE 2-2

| | water concn. (% by wt.) | concn. of alkali ions (ppm) | condition of dipping | | removal of resist residues | corrosion of Al alloy | electric property |
|---|---|---|---|---|---|---|---|
| | | | temperature (° C.) | time | | | |
| Comparative Example 1 | 99.0 | 0.5 | 23 | 5 | fair | poor | poor |
| Comparative Example 2 | 28.0 | 0.7 | 23 | 5 | poor | excellent | poor |
| Comparative Example 3 | 27.95 | 0.6 | 23 | 5 | fair | good | poor |
| Comparative Example 4 | 9.97 | 0.9 | 23 | 5 | fair | good | poor |

What is claimed is:

1. A cleaning liquid for semiconductor devices comprising
   (a) 0.1 to 5% by weight of a fluorine compound of the formula $R_4NF$, wherein R is a hydrogen atom or an alkyl group having 1 to 4 carbon atoms,
   (b) 72 to 80% by weight of an organic solvent soluble in water, said organic solvent being at least one solvent selected from the group consisting of amides, ethers, sulfones and sulfoxides, and
   (c) the remaining amount being water.

2. A cleaning liquid according to claim 1, wherein the fluorine compound is ammonium fluoride or tetramethylammonium fluoride.

3. A cleaning liquid according to claim 1, which comprises the fluorine compound in an amount of 0.5 to 1.5% by weight.

4. A cleaning liquid according to claim 1, wherein the organic solvent soluble in water is at least one solvent selected from the group consisting of dimethylformamide, dimethylacetamide, dimethylsulfoxide, and N-methylpyrrolidone.

5. A cleaning liquid according to claim 2, wherein the fluorine compound is an amount of 0.5 to 1.5% by weight.

6. A cleaning liquid according to claim 2, wherein the organic solvent soluble in water is at least one solvent selected from the group consisting of dimethylformamide, dimethylacetamide, dimethylsulfoxide, and N-methylpyrrolidone.

7. A cleaning liquid according to claim 5, wherein the organic solvent soluble in water is at least one solvent selected from the group consisting of dimethylformamide, dimethylacetamide, dimethylsulfoxide, and N-methylpyrrolidone.

8. An improved process for removing the residues of a resist film on a surface of a semiconductor device after a resist film has been etched and ashed, comprising contacting said resist residues with a cleaning liquid to remove said resist residues, the improvement comprising using the cleaning liquid of claim 1 as said cleaning liquid.

9. An improved process for removing the residues of a resist film on a surface of a semiconductor device after a resist film has been etched and ashed, comprising contacting said resist residues with a cleaning liquid to remove said resist residues, the improvement comprising using the cleaning liquid of claim 6 as said cleaning liquid.

10. An improved process for removing the residues of a resist film on a surface of a semiconductor device after a resist film has been etched and ashed, comprising contacting said resist residues with a cleaning liquid to remove said resist residues, the improvement comprising using the cleaning liquid of claim 7 as said cleaning liquid.

11. A cleaning liquid according to claim 1, wherein the organic solvent is in an amount of 72 to 75% by weight.

12. A cleaning liquid according to claim 3, wherein the organic solvent is in an amount of 72 to 75% by weight.

13. A cleaning liquid according to claim 3, wherein the fluorine compound is selected from the group consisting of ammonium fluoride, a hydrogen fluoride salt of methylamine, a hydrogen fluorine salt of ethylamine, a hydrogen fluoride salt of propylamine, tetramethylammonium fluoride and tetraethylammonium fluoride.

14. A cleaning liquid according to claim 13, wherein the organic solvent is at least one organic solvent selected from the group consisting of formamide, monomethylformamide, dimethylformamide, acetamide, methylacetamide, dimethylacetamide, N-methylpyrrolidone, ethylene glycol monomethyl ether, diethylene glycol monomethyl ether, diethylene glycol monobutyl ether, diethylene glycol dimethyl ether, diethylene glycol diethyl ether, sulfolane and dimethylsulfoxide.

15. A cleaning liquid according to claim 14, wherein the cleaning liquid has a concentration of 0.5 ppm or less of alkali metal ions.

16. A cleaning liquid according to claim 2, wherein the fluorine compound is in an amount of 0.5 to 1.5% by weight; the organic solvent is at least one solvent selected from the group consisting of dimethylformamide, dimethylacetamide, dimethylsulfoxide and N-methylpyrrolidone; the organic solvent is in an amount of 72 to 75% by weight; and the cleaning liquid has a concentration of 0.5 ppm or less of alkali metal ions.

17. A cleaning liquid according to claim 16, wherein the fluorine compound is ammonium fluoride.

18. An improved process for removing the residues of a resist film on a surface of a semiconductor device after a resist film has been etched and ashed, comprising contacting said resist residues with a cleaning liquid to remove said resist residues, the improvement comprising using the cleaning liquid of claim 16 as said cleaning liquid.

19. An improved process for removing the residues of a resist film on a surface of a semiconductor device after a resist film has been etched and ashed, comprising contacting said resist residues with a cleaning liquid to remove said resist residues, the improvement comprising using the cleaning liquid of claim 17 as said cleaning liquid.

* * * * *